United States Patent [19]

Suzuki

[11] Patent Number: 4,540,901
[45] Date of Patent: Sep. 10, 1985

[54] IMAGE-SENSING CHARGE-COUPLED DEVICE WITH BOTH HIGH-SPEED AND LOW-SPEED READ-OUTS

[75] Inventor: Nobuo Suzuki, Yokohama, Japan

[73] Assignee: Tokyo Shibaura Denki Kabushiki Kaisha, Kawasaki, Japan

[21] Appl. No.: 488,689

[22] Filed: Apr. 26, 1983

[30] Foreign Application Priority Data

Apr. 30, 1982 [JP] Japan .................................. 57-73066

[51] Int. Cl.³ ...................... H03K 3/42; G11C 19/28; H01L 29/78; H01L 27/14
[52] U.S. Cl. ..................................... 307/311; 357/24; 357/30; 377/60; 377/61
[58] Field of Search ................. 357/24 LR, 24 M, 30; 377/57–63; 307/311

[56] References Cited

U.S. PATENT DOCUMENTS 3,940,602  2/1976  Lagnado et al. ............... 357/24 LR
3,983,573  9/1976  Ishihara ........................ 357/24 LR
4,281,254  7/1981  Seachman ..................... 357/24 LR

OTHER PUBLICATIONS

IEEE International Electron Devices Meeting Technical Digest (1974), pp. 55–58, "Two–Phase Charge Coupled Linear Imaging Devices . . . ".
IEEE Trans. on Electron Devices, vol. EA-27, No. 9, p. 1808 (1980), "A 1024–Element Linear CCD Photo Sensor with Unique Photodiode . . . ".

Primary Examiner—Gene M. Munson
Attorney, Agent, or Firm—Schwartz, Jeffery, Schwaab, Mack, Blumenthal & Evans

[57] ABSTRACT

A solid image-sensing device, in which CCDs or the like are used, has a light-receiving part comprising a plurality of photosensitive cells disposed linearly and functioning to generate charges corresponding to light information projected incidently thereon, first and second charge-transfer paths on opposite sides of this light-receiving part, and a third charge-transfer path for deriving charges from the first and second charge-transfer paths, signals being read out alternately from the first and second charge-transfer paths at the time of high-speed readout, signals from the first and second charge-transfer paths being collected and read out through the third charge-transfer path during low-speed readout.

2 Claims, 6 Drawing Figures

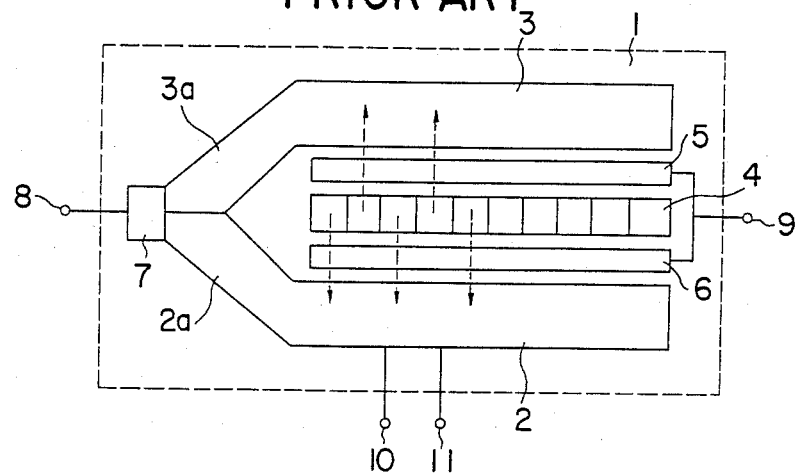
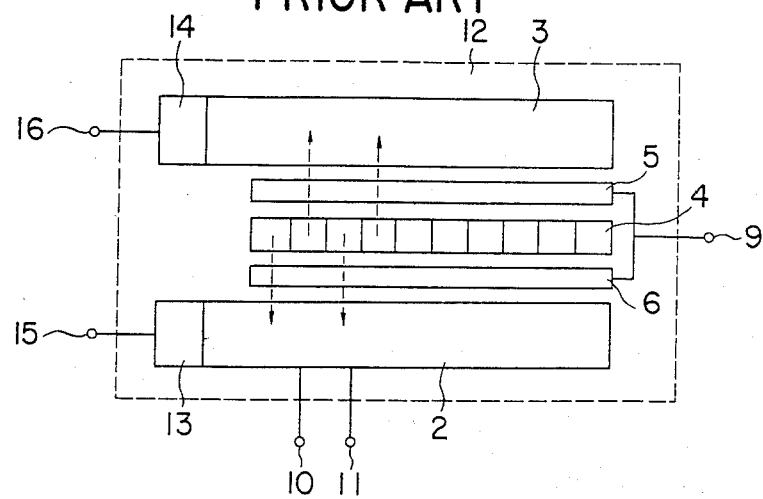

IMAGE-SENSING CHARGE-COUPLED DEVICE WITH BOTH HIGH-SPEED AND LOW-SPEED READ-OUTS

BACKGROUND OF THE INVENTION

This invention relates generally to solid image-sensing devices and more particularly to linear image sensors in which charge-transfer devices such as charge-coupled devices (CCD) are linearly arranged.

Various kinds of linear image sensors for successively reading out picture elements disposed in linear arrangement are known and are being used for high-speed operation or low-speed operation depending on their use.

However, a conventional linear image sensor is not adapted to be suitable for both high-speed operation and low-speed operation. That is, a linear image sensor suitable for low-speed operation is not suitable for high-speed operation, while the use of one adapted to be suitable for high-speed operation and for slow-speed operation is undesirable for reasons of cost.

SUMMARY OF THE INVENTION

It is an object of this invention, which has been achieved by seeking to overcome the problem of the prior art as described above, to provide a solid image-sensing device of simple constitution which is capable of being used for either high-speed operation or low-speed operation and, moreover, does not require an additional circuit for low-speed operation.

According to this invention, briefly summarized, there is provided, in a solid image-sensing device provided with: a light-receiving part comprising a plurality of photosensitive cells disposed in a straight-line state on a semiconductor substrate and generating charges corresponding to light information projected thereon; first and second charge-transfer paths respectively disposed on opposite sides of the light-receiving part for receiving and transferring the charges thus generated; and two shift gates respectively provided between the light-receiving part and the first and second charge-transfer paths and functioning to distribute and transfer the charges generated by the light-receiving part alternately to the first and second charge-transfer paths, the improvement wherein a third charge-transfer path having a discretely independent output part is connected respectively to the output end sides of the first and second charge-transfer paths, and the image-sensing device is operated to read out separate signals from the first and second charge-transfer paths at the time of high-speed readout and to read out signals alternately from the first and second charge-transfer paths by way of the third charge-transfer path at the time of slow-speed readout.

The nature, utility, and further features of this invention will be more clearly apparent from the following detailed description with respect to a preferred embodiment of the invention when read in conjunction with the accompanying drawings, briefly described below.

BRIEF DESCRIPTION OF THE DRAWINGS

In the accompanying drawings:

FIGS. 1 and 2 are planar views respectively showing examples of known solid image-sensing devices;

DETAILED DESCRIPTION OF THE INVENTION

Figure 3:
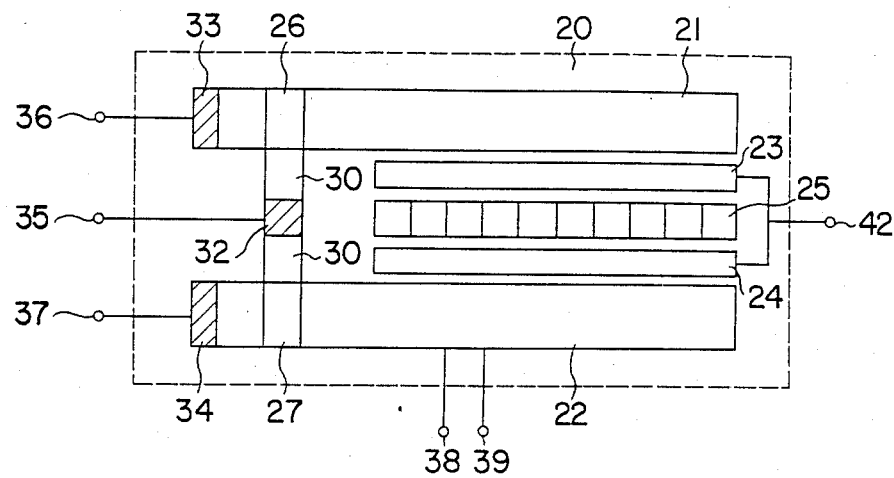
FIG. 3 is a similar view showing an example of practice of this invention.

As conducive to a full understanding of this invention, the general nature and limitations of solid image-sensing devices known in the art will first be briefly described with reference to FIGS. 1 and 2. Thereafter the solid image-sensing device according to this invention will be described with reference to FIGS. 3 through 6.

As mentioned hereinbefore, various kinds of linear image sensors for successively reading out picture elements disposed in linear arrangement are known. Examples of such sensors are as shown in FIGS. 1 and 2.

On a semiconductor substrate 1 (12), a plurality of cells constituting a light-receiving part 4 for generating electric charges corresponding to light information projected incidently thereon are disposed in a linear row. The charges thus generated by the light-receiving part 4 are transferred to the output terminal side by first and second charge-transfer paths 2 and 3 disposed along respectively opposite sides of the row of the light-receiving part 4. In correspondence with the cells of the light-receiving part 4, the charge-transfer paths 2 and 3 have a plurality of transfer electrodes (not shown) by which they transfer the generated charges to the output terminal side with specific shift pulses of two phases applied to terminals 10 and 11.

Shift gates 5 and 6 are respectively provided between the light-receiving part 4 and the two charge-transfer paths 2 and 3 and operate in response to gate pulses applied to a terminal 9 connected to the shift gates 5 and 6 to distribute the charges generated by every cell of the light-receiving part 4 successively and alternately to the two charge-transfer paths 2 and 3, thus accomplishing charge transfer. In FIGS. 1 and 2, the arrow marks indicate the transfer of charges from the light-receiving part 4 to the charge-transfer paths 2 and 3 by the operation of the shift gates 5 and 6.

In the example shown in FIG. 1, the two transfer paths 2 and 3 have convergingly bent parts 2a and 3a, and the signals of the two transfer paths 2 and 3 are read out through a single output part 7. In contrast, the two transfer paths 2 and 3 in the device shown in FIG. 2 respectively have independent output parts 13 and 14. The term "output part" is herein used as a generic term collectively denoting any of various elements such as an output gate, a MOS transistor for reading out, and an load resistor.

According to the device shown in FIG. 1, since the output signal is read out through a single output terminal 8 of the output part 7, there is no irregular deviation in the offset voltage between the signals applied to the first and second charge transfer paths 2 and 3, which is desirable for operation. With respect to the read-out signal, however, the reset time interval and the output signal interval are taken to constitute one period, and the resetting time for discarding signal charges is determined by the rising and falling times and amplitude of the resetting pulse as well as the length and width of the reset transistors and the thickness of the oxide film and accordingly has a direct influence on the operational speed.

The operational speed is broadly classified into classes called high speed of 10 MHz (or 5 MHz) or higher, medium speed of the order of 1 MHz, and low speed of the order of 100 KHz or lower. Examples of machines or devices operable at these speeds are copying machines requiring high-speed operation, facsimile machines operable with medium-speed operation, and automatic-focusing devices of cameras operable with low-speed operation. Here, for example, 10 MHz denotes reading out of one picture element in one hundred nanosecond. Further, the period of the readout signal is limited by the resetting interval. For example, when the resulting interval is 50 ns, the output signal period becomes zero at 20 MHz or higher, and operation becomes impossible.

According to the device shown in FIG. 2, the signals of the two charge-transfer paths 2 and 3 are read out by way of the output parts 13 and 14 through respectively independent terminals 15 and 16. For this reason, the effective readout frequency becomes one half of that in the case of FIG. 1, and high-speed operation is possible. However, since there are two output terminals, an offset voltage or a deviant irregularity in the signal voltage occurs between the output signals sent out through the terminals 15 and 16. In order to correct this deviation, an additional circuit is necessary, whereby the organization of the entire device becomes undesirably complicated and bulky. This drawback becomes particularly pronounced in comparison with the organization of the example shown in FIG. 1 which is suitable for low-speed readout.

A solid image-sensing device according to the preferred embodiment of this invention is shown in FIG. 3. In this device a light-receiving part 25, shift gates 23 and 24, and first, second and third charge transfer paths 21, 22, and 30 are provided on a semiconductor substrate 20.

The light-receiving part 25 comprises a plurality of cells, which generate charges corresponding to the light information projected thereon. Each cell comprises, for example, a diffusion semiconductor region which forms a pn junction between each of cells and the semiconductor substrate.

The shift gates 23 and 24 are driven by gate pulses applied to a terminal 42 and operate to send the charges generated by the light-receiving part 25 into the first and second charge transfer paths 21 and 22, respectively. More specifically, the gate pulses cause the charges of the light-receiving part 25 for every cell to be distributed successively and alternately to the two charge-transfer paths 21 and 22. These first and second charge-transfer paths 21 and 22 are, for example, CCDs and are disposed on the outer sides of and substantially parallel to the shift gates 23 and 24.

These transfer paths 21 and 22 have a plurality of transfer electrodes (not shown) and are driven by specific two-phase shift pulses applied to terminals 38 and 39 to transfer the above mentioned charges to the output side. The transfer paths 21 and 22 are provided at their output ends (or left-hand ends as viewed in FIG. 3) respectively with output parts 33 and 34 having output terminals 36 and 37. The output parts 33 and 34 comprise various components such as output gates, MOS transistors for reading out, and load resistors.

At intermediate parts of the transfer paths 21 and 22 near, but short of, the output parts 33 and 34, branch electrodes 26 and 27 are respectively provided, and the aforementioned third charge-transfer path 30 is connected between these branch electrodes 26 and 27. A discretely independent output part 32 having a terminal 35 is provided at the middle part of the third charge-transfer path 30.

By leading out signals through the two output terminals 36 and 37 at the time of high-speed operation of the device of the above described organization and leading out signals only through the output terminal 35 at the time of low-speed operation, the desired high-speed readout can be accomplished, and low-speed readout can also be carried out. The nature of these operations will now be described more fully.

Figure 4:
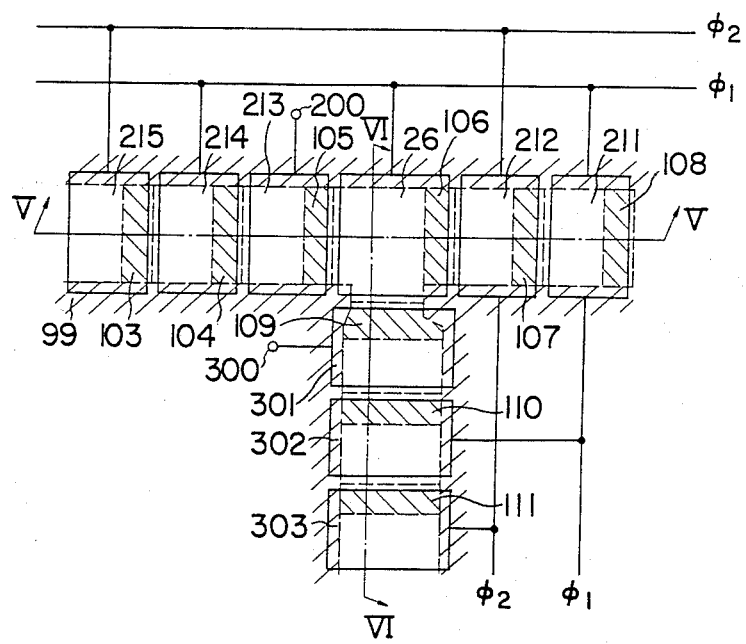
FIG. 4 is a planar view showing the planar construction in the region of a branch electrode of the solid image-sensing device illustrated in FIG. 3.
Figure 5:
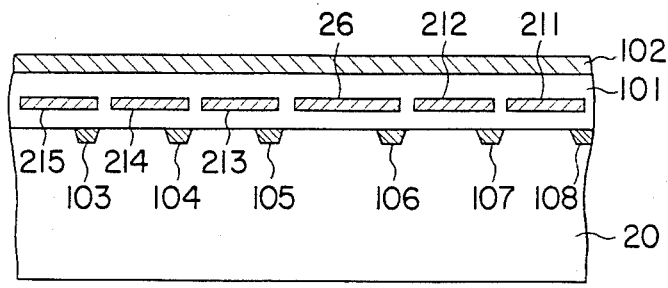
FIG. 5 is a sectional view taken in the plane indicated by line V—V in FIG. 4.
Figure 6:
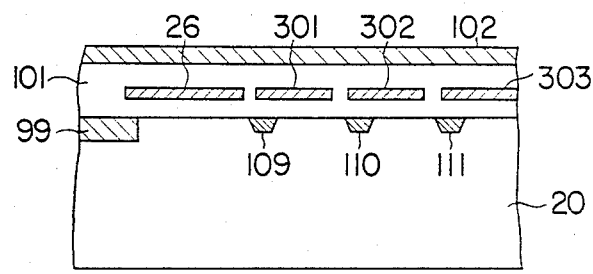
FIG. 6 is a sectional view taken in the plane indicated by line VI—VI in FIG. 4.

The structure in the region around the branch electrode 26 in the example shown in FIG. 3 is illustrated in greater detail in planar view in FIG. 4, and the sections taken along the planes indicated by lines V—V and VI—VI in FIG. 4 are respectively shown in FIGS. 5 and 6.

On the opposite left and right sides (as viewed in FIG. 4) of the branch electrode 26, transfer electrodes 213, 214, and 215 and transfer electrodes 212 and 211 are respectively disposed in a straight-line row. Furthermore, transfer electrodes 301, 302, and 303 are disposed in a row downward (as viewed in FIG. 4) from the branch electrode 26. These transfer electrodes 211 through 215, 301, 302, and 303 are implanted within an insulation film 101, which is supported on the aforementioned semiconductor substrate 20 of p type and is covered over its outer surface by a light-shielding film 102 made of aluminum, for example.

Of the parts of the semiconductor substrate 20 below the transfer electrodes, p-type semiconductor regions 103 through 111 on the near side as viewed in the transfer direction are adapted to be shallow potential wells, while the other parts are adapted to be deep potential wells. The parts of the semiconductor substrate 20 not below the transfer electrodes are made to be P+ zones 99 for channel stopping. Of two-phase clock pulses $\phi_1$ and $\phi_2$, clock pulses $\phi_1$ are imparted to the branch electrode 26 and the transfer electrodes 211, 214, and 302, while the other clock pulses $\phi_2$ are imparted to the transfer electrodes 212, 215, and 303. Furthermore, terminals 200 and 300 for imparting the clock pulse $\phi_2$ or ground (earth) potential are respectively connected to the transfer electrodes 213 and 301 adjacent to the branch electrode 26.

The charge transferring operation with respect to the parts around the branch electrode 26 is as described below. Description of that with respect to the branch electrode 27 will be omitted since it is the same.

First, in the case where high-speed operation is to be carried out, the clock pulses $\phi_2$ are applied to the terminal 200 of the transfer electrode 213, and ground (earth) potential is applied to the terminal 300 of the transfer electrode 301. Then the two-phase clock pulses $\phi_1$ and $\phi_2$ are applied to each of the transfer electrodes as described above, whereupon the signal charges are successively transferred from the right to the left of the branch electrode 26 as viewed in FIG. 4 and the terminal 36 of the output part 33 (FIG. 3).

By this transfer of the signal charges, the charges which have arrived at the branch electrode 26 are successively transferred in accordance with the timing of the clock pulses to the side of the electrodes 213 and 214 and are not switched to the side of the electrode 301. By carrying out the same operation also on the side of the transfer path 22, charges can be transferred to the side of the output part 34.

By the operation as described above, information corresponding to odd-number and even-number cells of the light-receiving part 25 can be read out at high speed respectively from the terminals 36 and 37.

Next, in the case where slow-speed operation is to be carried out, ground (earth) potential is applied to the terminal of the transfer electrode 213, and the clock pulses $\phi_2$ are applied to the terminal 300 of the transfer electrode 301. Then, when the two-phase clock pulses $\phi_1$ and $\phi_2$ are applied to each of the transfer electrodes, the signal charges are transferred from right to left as viewed in FIG. 4 to the branch electrode 26 and are then transferred downward as viewed in FIG. 4 from the branch electrode 26. At this time, an output is produced at the output part 32 (FIG. 3).

By this operation, the charges which have reached the branch electrode 26 are successively transferred in accordance with timing of the clock pulses to the side of the electrodes 301 and 302 and do not move to the side of the electrode 213. By carrying the same operation also on the side of the transfer path 22, charges can be transferred to the side of the output part 32.

Accordingly, by establishing a phase difference of 180 degrees between the timing of the clock pulses for moving the charges from the transfer path 21 toward the output part 32 and the timing of the clock pulses for moving the charges from the transfer path 22 toward the output part 32, information corresponding to the odd-number and even-number cells of the light-receiving part 25 can be read out alternately in accordance with the timing of the clock pulses from the output part 32.

Thus, according to this invention, by providing three charge transfer paths and using these paths by switching them according to variation of potential, a solid image-sensing device which can cope with either high-speed operation or low-speed operation and, moreover, is of a simple organization not requiring a supplementary circuit for low-speed operation can be provided.

What is claimed is:

1. In a solid image-sensing device provided with: a light-receiving part comprising a plurality of photosensitive cells disposed in a straight-line state on a semiconductor substrate and generating charges corresponding to light information projected thereon; first and second charge-transfer paths respectively disposed on opposite sides of the light-receiving part for receiving and transferring the charges thus generated; and two shift gates respectively provided between the light-receiving part and the first and second charge-transfer paths and functioning to distribute and transfer the charges generated by the light-receiving part alternately to the first and second charge-transfer paths, the improvement wherein a third charge-transfer path having a discretely independent output part is connected respectively to the output end sides of the first and second charge-transfer paths, and the image-sensing device is operated to read out separate signals from the first and second charge-transfer paths at the time of high-speed readout and to alternately read out signals from the first and second charge-transfer paths by way of the third charge-transfer path at the time of slow-speed readout.

2. A solid image-sensing device according to claim 1 which is so adapted that changing over between high-speed readout and slow-speed readout is carried out by changing voltages applied to a part of transfer electrodes of the first, second, and third charge-transfer paths.

* * * * *